United States Patent
Agata et al.

(10) Patent No.: US 7,203,117 B2
(45) Date of Patent: Apr. 10, 2007

(54) SEMICONDUCTOR INTEGRATED CIRCUIT

(75) Inventors: Masashi Agata, Osaka (JP); Masanori Shirahama, Shiga (JP); Toshiaki Kawasaki, Osaka (JP); Ryuji Nishihara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 11/245,075

(22) Filed: Oct. 7, 2005

(65) Prior Publication Data

US 2006/0083046 A1 Apr. 20, 2006

(30) Foreign Application Priority Data

Oct. 18, 2004 (JP) ............... 2004-302567

(51) Int. Cl.
*G11C 17/18* (2006.01)
(52) U.S. Cl. .................... 365/225.7; 365/96
(58) Field of Classification Search ............ 365/225.7, 365/96, 200
See application file for complete search history.

(56) References Cited

U.S. PATENT DOCUMENTS 7,158,435 B2 * 1/2007 Kobayashi et al. ...... 365/225.7

2004/0085119 A1 * 5/2004 Hokenmaier ............... 327/525

FOREIGN PATENT DOCUMENTS

WO   WO 97/12401   4/1997

* cited by examiner

*Primary Examiner*—Anh Phung
(74) *Attorney, Agent, or Firm*—McDermott Will & Emery LLP

(57) ABSTRACT

A fuse device and a program transistor are connected in series with each other. A flip-flop turns ON, in response to a start signal, the program transistor to start program of the fuse device. A 2-input NAND circuit outputs an end signal at a time point where change in a resistance value of the fuse device is increased to reach a predetermined level while monitoring change in the resistance value of the fuse device through change in a voltage at a junction point of the fuse device and the program transistor. The flip-flop turns OFF, in response to the end signal, the program transistor to automatically terminate the program of the fuse device. Thus, the resistance value of the fuse device is increased to the predetermined level in a minimum program time.

14 Claims, 4 Drawing Sheets

SEMICONDUCTOR INTEGRATED CIRCUIT

BACKGROUND OF THE INVENTION

The present invention relates to a semiconductor integrated circuit including a programmable fuse device.

A large-scale integrated circuit including a processor, a memory, a PLL (phase locked loop) circuit and the like, i.e., a so-called "system LSI" has been known. There are many cases where in such a system LSI, a fuse device is used as a simple program device of a memory repair circuit, a PLL tuning circuit or the like.

As a type of known fuse devices to be provided on a semiconductor substrate, a fuse device having a two-layered structure including a polysilicon layer and a silicide layer has been used. In such a fuse device, at least part of a silicide layer is blown by a current flowing during application of a predetermined program voltage and a resistance value is increased. Only a very small change (specifically, a difference of one or two orders of magnitude) in resistance value between non-programmed state and programmed state of the fuse device is observed. Accordingly, a detector used for detecting a state of the fuse device has to have sufficient sensitivity for detecting a relatively small change in a resistance value of the fuse device (see WO97/12401).

To program (blow) a single fuse device shown in the background art, a current of several tens mA is required. Therefore, a large number of fuse devices cannot be programmed together at a time. Practically speaking, fuse devices are programmed in order so that several to several tens of fuse devices are processed at a time.

Moreover, a time required for programming a single fuse device is several hundred μs to several ms. In a known technique, when a current is fed through a fuse device only for a predetermined time, a program process is temporality stopped to judge whether or not the fuse device is programmed. Then, if a resistance value of the fuse device is not increased to reach a predetermined level, the program process is executed again for a certain amount of time.

In the conventional system LSI, the number of fuse devices installed therein is several tens to 100. Therefore, even when a program time is ensured to provide a sufficient margin of a time required for programming each fuse device, the program time hardly affects test costs, so that the test costs are not increased. However, in a recent system LSI, 500 to 1000 fuse devices have to be provided, and thus, if only the same amount of time as that in the known technique is used for programming each fuse device, a program time is increased. This results in increase in test costs.

SUMMARY OF THE INVENTION

It is therefore an object of the present invention to reduce a time for programming a fuse device while ensuring a high resistance value in a programmed state of the fuse device, thereby suppressing increase in costs for testing a semiconductor integrated circuit.

To achieve the above-described object, according to the present invention, change in a resistance value of a fuse device is monitored at all the time, so that a program process for the fuse device can be terminated as soon as the resistance value of the fuse device is increased to reach a predetermined level.

Specifically, according to the present invention, the configuration in which a fuse device in which at least part is blown by a current flowing in the fuse device during application of a program voltage and a resistance value is increased; a program transistor connected to the fuse device in series to form a series circuit, the series circuit being connected to a program power supply; a program start circuit for turning ON, in response to a start signal, the program transistor and thereby starting program of the fuse device; a program monitoring circuit for monitoring change in a resistance value of the fuse device through change in a voltage at a junction point of the fuse device and the program transistor and outputting an end signal at a time point where the resistance value of the fuse device is increased to reach a predetermined resistance value; and a program end circuit for tuning OFF, in response to the end signal, the program transistor and thereby terminating the program of the fuse device are provided in a single semiconductor integrated circuit is adopted.

DESCRIPTION OF THE PREFERRED EMBODIMENTS

Hereafter, embodiments of the present invention will be described with reference to the accompanying drawings.

Figure 1:
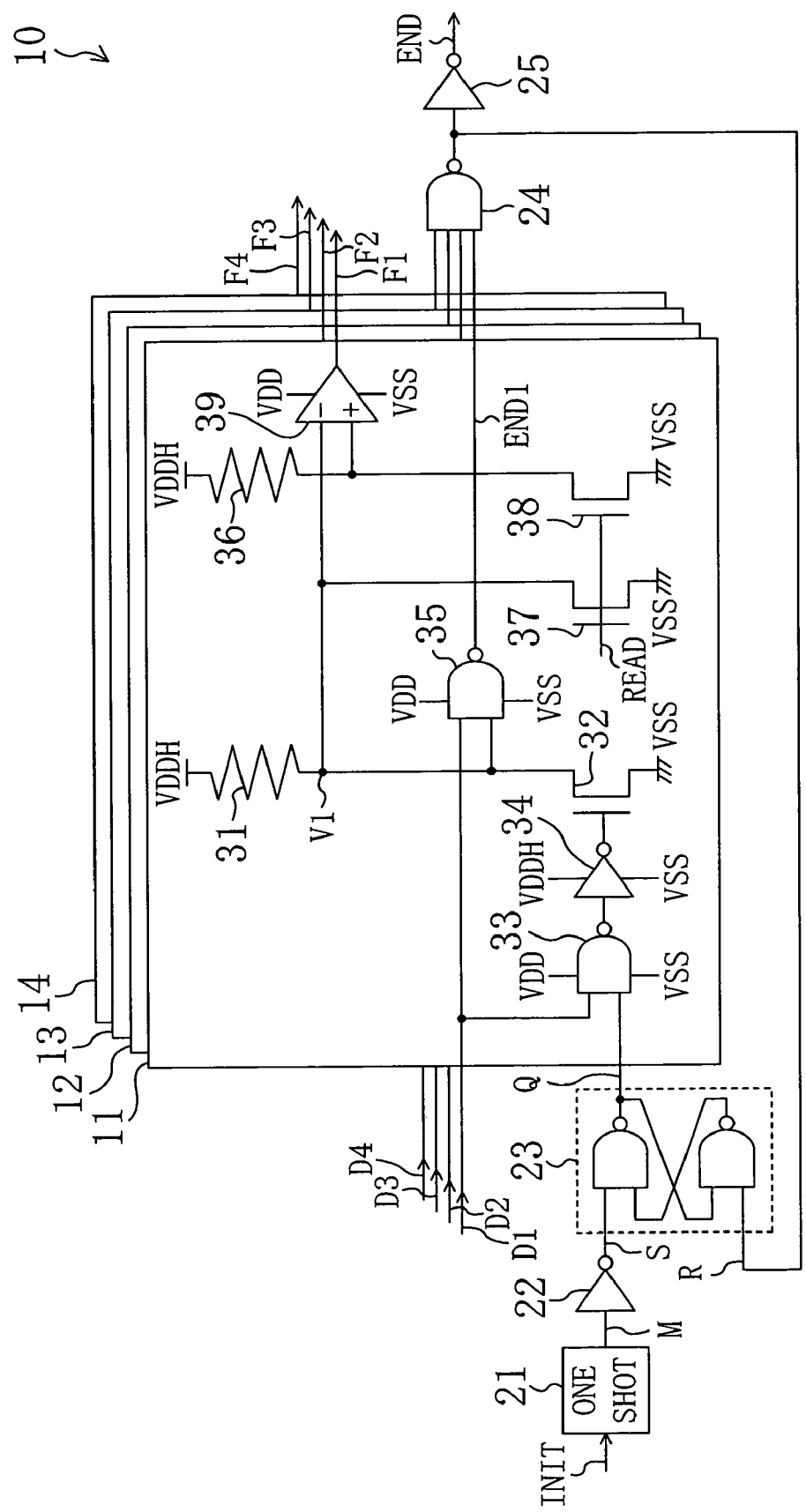
FIG. 1 is a circuit diagram illustrating an exemplary configuration of a fuse module provided in a semiconductor integrated circuit according to the present invention.

FIG. 1 is a circuit diagram illustrating an exemplary configuration of a fuse module provided in a semiconductor integrated circuit (system LSI) according to the present invention. In a fuse module 10 of FIG. 1, fuse cores 11, 12, 13 and 14, a one-shot circuit (monostable multivibrator) 21, inverters 22 and 25, a flip-flop 23, and a 4-input NAND circuit 24 are provided. In this example, the four fuse cores 11 through 14 are programmed in parallel. D1, D2, D3 and D4 are program inputs to the four fuse cores 11 through 14, respectively.

In the fuse core 11, a fuse device 31, a program transistor 32, 2-input NAND circuits 33 and 35, a level shifter 34, a reference resistance element 36, a read transistor 37, a reference transistor 38, and a differential amplifier 39 are provided. The fuse device 31 has a two-layered structure including a polysilicon layer and a silicide layer or a single-layered structure of a metal layer. At least part of the fuse device 31 is blown by a current flowing therein during application of a predetermined program voltage and a resistance value is increased. The reference resistance element 36 has a single-layered structure of polysilicon. Each of the program transistor 32, the read transistor 37 and the reference transistor 38 is an n-channel MOS transistor. VDD, VDDH and VSS denote a low voltage power source (for example, 1.2 V), a high voltage power source (for example, 3.3 V), and a ground voltage (=0 V), respectively. An end of the fuse device 31 is connected to a high voltage power source VDDH, another end of the fuse device 31 is connected to a ground voltage VSS via the program transistor 32 and is also connected to a voltage VSS via the read transistor 37. One end of the reference resistance element 36 is connected to the high voltage power source VDDH and the other end of the reference resistance element 36 is connected to a ground voltage VSS via the reference transistor 38. The power supply source for the level shifter 34 is the high voltage power source VDDH and the power source for each of the 2-input NAND circuits 33 and 35 and the differential amplifier 39 is the low voltage power source VDD.

Figure 2:
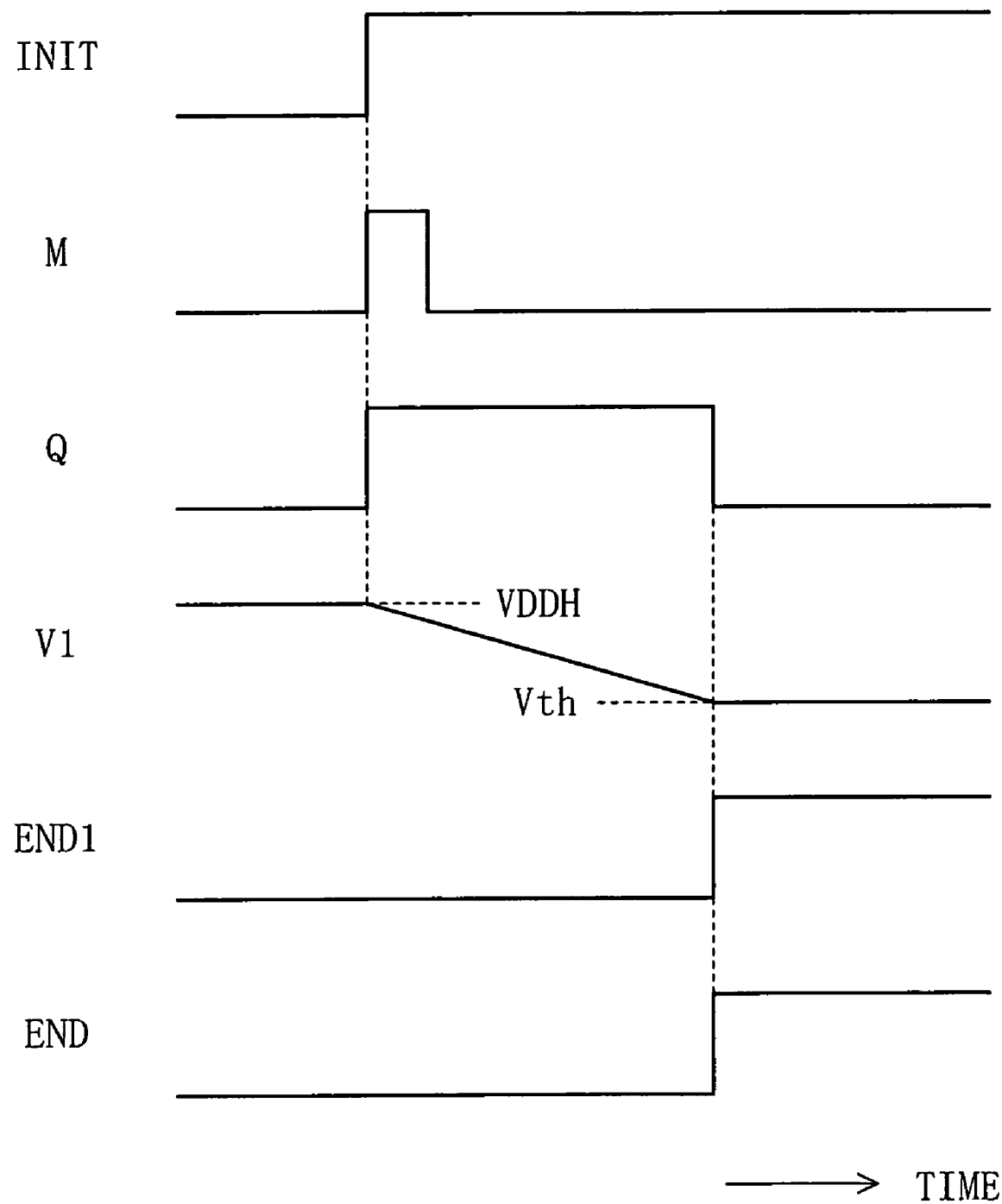
FIG. 2 is a signal waveform chart illustrating a program process of the fuse module of FIG. 1.

FIG. 2 illustrates a program process of the fuse module 10 of FIG. 1. When the one-shot circuit 21 receives a module program start signal INIT which is a level signal, the one-shot circuit 21 supplies a multivibrator output M having a constant pulse width to the inverter 22. The inverter 22 supplies, as a negative logic set input S, a signal obtained by inversing the multivibrator output M to the flip-flop 23. A Q output of the flip-flop 23 is given to each of the four fuse cores 11 through 14. In the first fuse core 11, the Q output of the flip-flop 23 and a program input D1 are two inputs of the NAND circuit 33. An output of the 2-input NAND circuit 33 is given to a gate of the program transistor 32 via the level shifter 34. That is, only when D1=1 (high) holds, the program transistor 32 is turned ON by the Q output of the flip-flop 23. When the program transistor 32 is turned ON, a current is started flowing from the high voltage power supply VDDH, which is the program power source, to the fuse device 31. As a result, a resistance value of the fuse device 31 is gradually increased and thus a voltage of V1 at a junction point of the fuse device 31 and the program transistor 32 is gradually reduced. The voltage V1 and the program input D1 are two inputs to the NAND circuit 35. The 2-input NAND circuit 35 monitors change in resistance value of the fuse device 31 through change in the voltage V1, and outputs a core program end signal END1 at a time point where a resistance value of the fuse device 31 is increased to reach a predetermined resistance value. Specifically, at a time point where the voltage V1 goes below an input threshold voltage Vth of the NAND circuit 35, the core program end signal END1 is changed from Low level to High level. The 4-input NAND circuit 24 supplies a Low level output at a time point where the core program end signal END1 is obtained from the first fuse core 11 and the other core program end signals are obtained from the second through fourth fuse cores 12 through 14. An output of the 4-input NAND circuit 24 not only becomes a module program end signal END via the inverter 25 but also is given as a negative logic reset input R to the flip-flop 23. FIG. 2 shows an example in which a program of the first fuse core 11 is ended at the latest. The core program end signal END1 is changed to High level and, at the same time, the module program end signal END is changed to High level. Also, the Q output of the flip-flop 23 is reset then. Thus, respective program processes of the four fuse cores 11 through 14 are ended and the program transistor 32 is turned OFF, so that a current no longer flows in the fuse device 31.

FIG. 1 also illustrates a configuration for checking whether or not the fuse device 31 is in a programmed state. This configuration will be described next. The reference resistance element 36 has a resistance value which is higher than a resistance value of the fuse device 31 in a non-programmed state and lower than the lowest expected resistance value of the fuse device 31 in a programmed state. The read transistor 37 has a higher ON resistance than an ON resistance of the program transistor 32. The reference transistor 38 has an ON resistance subsequently equal to the ON resistance of the program transistor 32. When the read signal READ becomes High level, each of the read transistor 37 and the reference transistor 38 is turned ON. However, the program transistor 32 is not turned ON. At this time, the differential amplifier 39 amplifies a difference between a voltage at a junction point of the fuse device 31 and the read transistor 37 and a voltage at a junction point of the reference resistance element 38 and the reference transistor 38 and supplies a program output F1 of the first fuse core 11. Specifically, when the fuse device 31 is in a non-programmed state, F1=0 (Low) holds, and when the fuse device 31 is in a programmed state, F1=1 (High) holds. F2, F3 and F4 are program outputs of the other three fuse cores 12, 13 and 14, respectively.

In order to ensure a read operation margin of the fuse device 31, a voltage at a junction point of the reference resistance element 36 and the reference transistor 38, i.e., an input threshold voltage of the differential amplifier 39 is preferably set to be higher than an input threshold voltage of the 2-input NAND circuit 35 which operates in programming the fuse device 31. Even when an inverter is used, instead of the reference resistance element 36, the reference transistor 38 and the differential amplifier 39, an input threshold value of the inverter is preferably set to be higher than the input threshold voltage of the 2-input NAND circuit 35.

Figure 3:
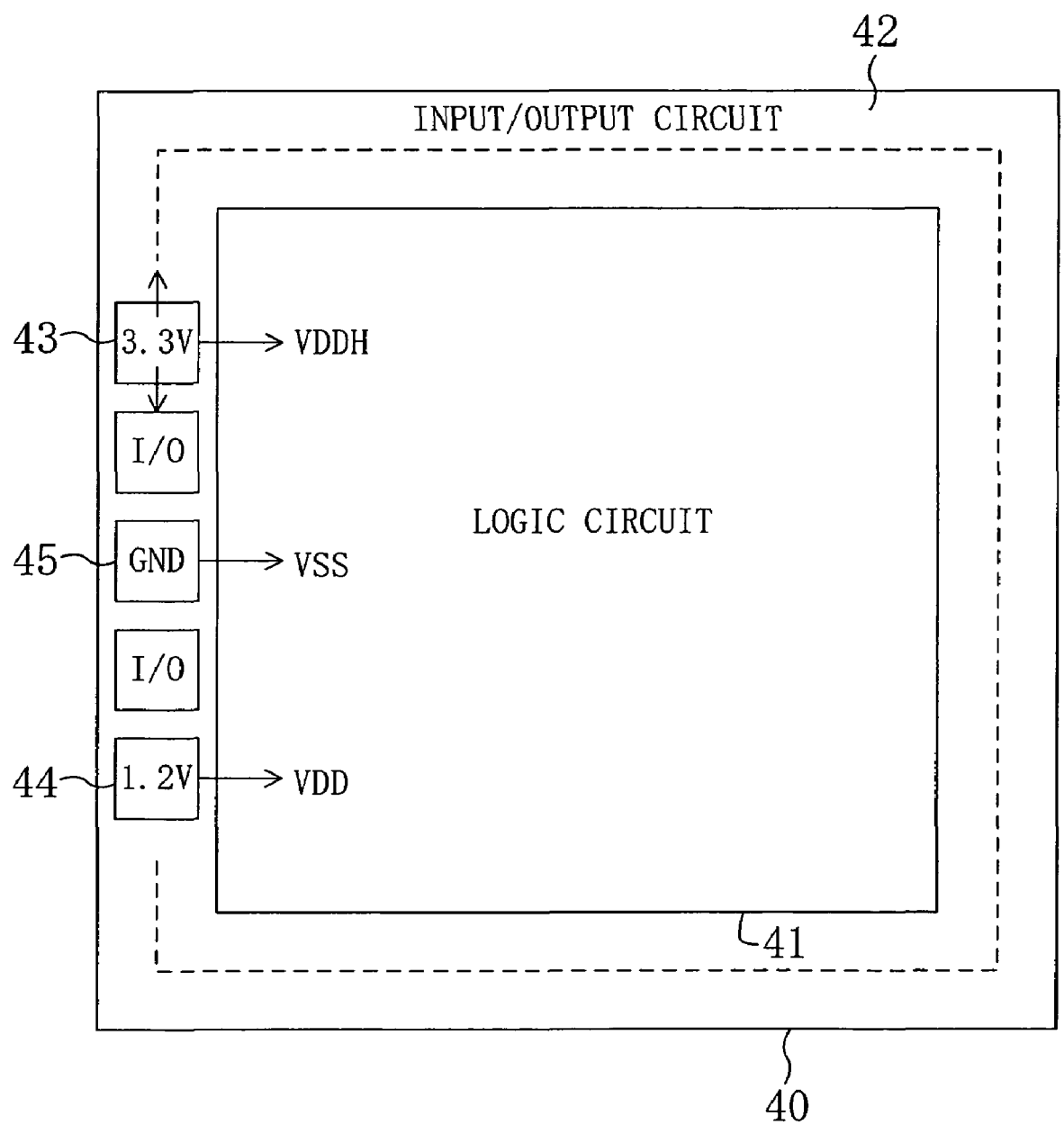
FIG. 3 is a chip plan view illustrating a semiconductor integrated circuit including the fuse module of FIG. 1 in a logic circuit.

FIG. 3 is a chip plan view illustrating a system LSI including the fuse module 10 of FIG. 1 in a logic circuit. The system LSI 40 of FIG. 3 includes a logic circuit 41 in a chip center part and an input/output circuit 42 in a chip peripheral part. In the logic circuit 41, a large number of fuse modules 10 of FIG. 1 are provided. In the input/output circuit 42 including a large number of input/output cells (I/O cells), a high voltage power source pad 43, a low voltage power source pad 44 and a ground pad 45 are provided. A high voltage power source VDDH supplied by the high voltage power supply pad 43 serves as a power source for the I/O cells in the input/output circuit 42 and also as a power source for the fuse device 31 of FIG. 1 and the like. Moreover, a low voltage power source VDD supplied by the low voltage power source pad 44 serves as a power source for the logic circuit 41 and also as a power source for the 2-input NAND circuits 33 and 35 and the like. As described, it is preferable that the I/O cell power source is used as a program power source of the fuse device 31 as well.

Figure 4:
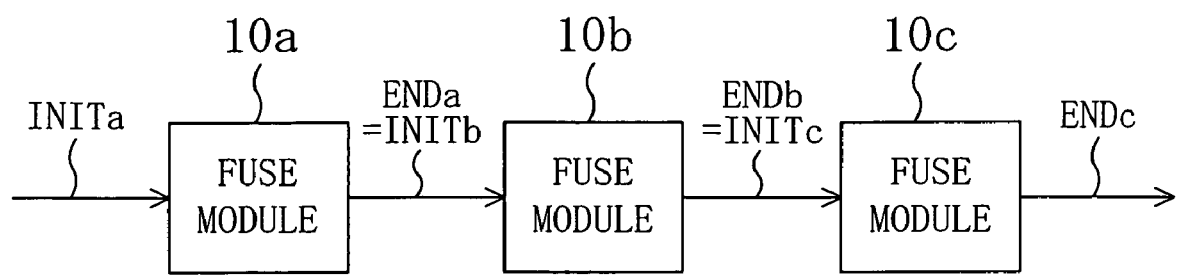
FIG. 4 is a conceptual diagram illustrating an exemplary configuration of a connection of a plurality of fuse modules.
Figure 5:
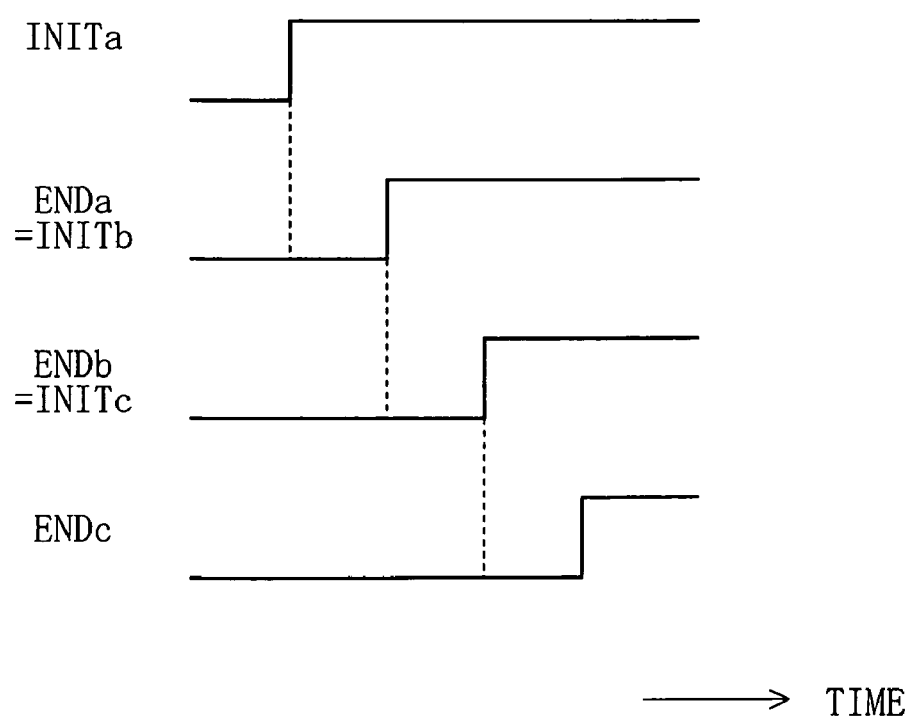
FIG. 5 is a signal waveform chart describing the operation of the configuration of FIG. 4.

FIG. 4 illustrates an exemplary configuration of a connection of a plurality of fuse modules. Each of three modules 10a, 10b and 10c of FIG. 4 has the configuration of FIG. 1. INITa and ENDa are program start signal and program end signal of the first fuse module 10a, respectively, INITb and ENDb are program start signal and program end signal of the second fuse module 10b, respectively, and INITc and ENDc are program start signal and program end signal of the third fuse module 10c, respectively. In this case, as shown in FIG. 4, ENDa=INITb and ENDb=INITc hold. That is, for example, as shown in FIG. 5, by connecting the fuse modules 10a, 10b and 10c in a chain like manner, a program of the second fuse module 10b can be started at the instant when a program of the first fuse module 10a is ended.

Note that in FIG. 1, the fuse device 31 and the program transistor 32 formed of an N-channel MOS transistor are provided so as to be connected in series with each other and be located closer to the high voltage power source VDDH and closer to the ground voltage VSS, respectively. Thus, as the program proceeds, the voltage V1 at a junction point of the fuse device 31 and the program transistor 32 is gradually reduced. In contrast, the configuration in which a program transistor formed of a P-channel MOS transistor and a fuse device are provided so as to be connected in series with each other and be located closer to the high voltage power source VDDH and closer to the ground voltage VSS, respectively, can be used. In this case, however, as the program proceeds, a voltage at a junction point of the program transistor and the fuse device is gradually increased. Therefore, to ensure a read operation margin of the fuse device, an input threshold voltage of a differential amplifier (or an inverter replacing the differential amplifier) constituting a voltage detector is preferably set to be lower than an input threshold voltage of a logic circuit constituting a program monitoring circuit.

As has been described, according to the present invention, a high resistance value can be maintained in a programmed state of a fuse device and also a time required for programming the fuse device can be reduced. Therefore, the present invention is useful as a circuit technology for a system LSI including a processor, a memory, a PLL circuit and the like.

What is claimed is:

1. A semiconductor integrated circuit comprising:
   a fuse device in which at least part is blown by a current flowing in the fuse device during application of a program voltage and a resistance value thereof is increased;
   a program transistor connected to the fuse device in series to form a series circuit, the series circuit being connected to a program power supply;
   a program start circuit for turning ON, in response to a start signal, the program transistor and thereby starting program of the fuse device;
   a program monitoring circuit for monitoring change in a resistance value of the fuse device through change in a voltage at a junction point of the fuse device and the program transistor and outputting an end signal at a time point where the resistance value of the fuse device is increased to reach a predetermined resistance value; and
   a program end circuit for turning OFF, in response to the end signal, the program transistor and thereby terminating the program of the fuse device.

2. The semiconductor integrated circuit of claim 1, wherein the fuse device has a two-layered structure including a polysilicon layer and a silicide layer or a single-layered structure of a metal layer.

3. The semiconductor integrated circuit of claim 1, wherein the program start circuit has the function of determining, according to a program input, whether or not to start the program of the fuse device.

4. The semiconductor integrated circuit of claim 1, wherein the program start circuit and the program end circuit include a flip-flop which is set by the start signal and reset by the end signal, and
   wherein ON/OFF control of the program transistor is controlled according to an output of the flip-flop.

5. The semiconductor integrated circuit of claim 1, wherein a voltage of the program power source is set to be higher than a voltage of an operation power source for operating a logic circuit constituting the program monitoring circuit.

6. The semiconductor integrated circuit of claim 5, further comprising:
   a logic circuit; and
   an input/output circuit,
   wherein the program power source serves in common as a power source of the input/output circuit and the operation power source serves in common as a power source of the logic circuit.

7. The semiconductor integrated circuit of claim 1, further comprising:
   a read transistor having a higher ON resistance than an ON resistance of the program transistor and provided so as to be in parallel to the program transistor and be connected with the fuse device in series;
   a voltage detector for sensing a voltage at a junction point of the fuse device and the read transistor to check whether or not the fuse device is in a programmed state; and
   a read control circuit for performing control so as to turn ON the read transistor during an OFF state of the program transistor.

8. The semiconductor integrated circuit of claim 7, wherein the series circuit of the fuse device and the program transistor is so configured that the voltage at the junction point of the fuse device and the program transistor is reduced when a resistance value of the fuse device is increased, and
   wherein an input threshold voltage of the voltage detector is set to be higher than an input threshold voltage of a logic circuit constituting the program monitoring circuit.

9. The semiconductor integrated circuit of claim 7, wherein the series circuit of the fuse device and the program transistor is so configured that the voltage at the junction point of the fuse device and the program transistor is increased when a resistance value of the fuse device is increased, and
   wherein an input threshold voltage of the voltage detector is set to be lower than an input threshold voltage of a logic circuit constituting the program monitoring circuit.

10. The semiconductor integrated circuit of claim 7, wherein the voltage detector includes:
    a reference resistance element,
    a reference transistor having an ON resistance substantially equal to an ON resistance of the program transistor and connected with the reference resistance element in series to form a series circuit, the series circuit being connected to the program power source, and
    a differential amplifier for amplifying a difference between a voltage at a junction point of the fuse device and the read transistor and a voltage at a junction point of the reference resistance element and the reference transistor, and
    wherein the read control circuit has the function of turning ON the reference transistor as well as the read transistor.

11. The semiconductor integrated circuit of claim 10, wherein the reference resistance element has a single-layered structure of polysilicon.

12. The semiconductor integrated circuit of claim 10, wherein the reference resistance element has a resistance value which is higher than a resistance value of the fuse device in a non-programmed state and lower than a lowest expected resistance value of the fuse device in a programmed state.

13. The semiconductor integrated circuit of claim 1, comprising a plurality of fuse cores,
    wherein each of the plurality of fuse cores includes the fuse device, the program transistor and the program monitoring circuit, wherein the program start circuit has the function of turning ON, in response to the start signal, the program transistor of each of the plurality of fuse cores, and wherein the program end circuit has the function of turning OFF the program transistor of each of the plurality of fuse cores when all the respective program monitoring circuits of the plurality of fuse cores output the end signal.

14. The semiconductor integrated circuit of claim 1, comprising a plurality of fuse modules, wherein each of the plurality of fuse modules includes the fuse device, the program transistor, the program start circuit, the program monitoring circuit, and the program end circuit, and wherein the start signal to be given to one of the plurality of fuse modules is the end signal output from one of the rest of the plurality of fuse modules.

* * * * *